United States Patent [19]

Hassanzadeh et al.

[11] Patent Number: 5,761,041
[45] Date of Patent: Jun. 2, 1998

[54] MECHANICAL HEAT SINK ATTACHMENT

[75] Inventors: Ali Hassanzadeh, San Jose; Hassan Sihpolo, Campbell, both of Calif.

[73] Assignee: Sun Microsystems, Inc., Mountain View, Calif.

[21] Appl. No.: 670,093

[22] Filed: Jun. 25, 1996

[51] Int. Cl.⁶ ....................................... H05K 7/20
[52] U.S. Cl. .......................... 361/704; 248/510; 257/719; 267/158; 361/719
[58] Field of Search ..................... 24/453, 457, 458; 174/16.3; 165/80.3, 185; 267/150, 158, 160; 248/316.7, 505, 510; 257/706, 707, 718, 719, 727; 411/352, 511, 516, 529, 525, 526; 361/703, 704, 707, 709–712, 717–719

[56] References Cited

U.S. PATENT DOCUMENTS

| | | | |
|---|---|---|---|
| 5,019,940 | 5/1991 | Clemens | 361/386 |
| 5,371,652 | 12/1994 | Clemens | 361/704 |
| 5,384,940 | 1/1995 | Soule | 361/719 |
| 5,504,652 | 4/1996 | Foster | 361/704 |
| 5,541,811 | 7/1996 | Henningsson | 361/704 |
| 5,570,271 | 10/1996 | Lavochkin | 361/704 |
| 5,600,540 | 2/1997 | Blomquist | 361/704 |
| 5,602,719 | 2/1997 | Kinion | 361/704 |
| 5,621,615 | 4/1997 | Dawson | 361/704 |

*Primary Examiner*—Gerald P. Tolin
*Attorney, Agent, or Firm*—Julian Caplan; Flehr Hohbach Test Albritton & Herbert LLP

[57] ABSTRACT

A leaf type spring is used to hold a heat sink in contact with a chip or other heat-emitting component. Such a component may be mounted on a PCB or other element. A bolster plate is positioned below the PCB and two pins extend up from the bolster plate, through the PCB and through the base of a heat sink. A preferred heat sink has plural fins extending up from the base. In one form of the invention the pins extend above the level of the outer ends of the pins. A spring extends diagonally across the ends of the fins. Slots in the ends of the spring engage necks formed near the ends of the pins. In another form of the invention the fins are milled or otherwise formed with a groove extending diagonally across the heat sink and the spring fits into the slot. The pins extend only a short distance above the base of the heat sink and are necked to receive the slotted ends of the spring. In both forms of the invention intimate contact of the base with the heat emitting component improves heat transfer.

9 Claims, 3 Drawing Sheets

MECHANICAL HEAT SINK ATTACHMENT

BACKGROUND OF THE INVENTION

1. Field of the Invention

This invention relates to a new and improved mechanical heat sink attachment. More particularly the invention relates to the use of a spring applying downward pressure on a heat sink to maintain contact with an electronic chip or other heat emitting component mounted on a PCB or other element to improve the heat transfer between the element and the heat sink.

2. Related Art

Heretofore heat sinks have been attached to the chip or die by means of a plastic clip and by solder or other heat attachment means. Stress was imparted to the plastic clip causing it to break and impairing the thermal transfer from the chip or die to the heat sink. The present invention uses a spring which applies a constant force to the heat sink and is not likely to break under stress.

SUMMARY OF THE INVENTION

The spring used in connection with the present invention applies a constant force to the heat sink. The spring is manually attached to two pins which extend up from a bolster plate located below the printed circuit board on which the chip or other heat emitting element is mounted. The pins extend through holes in the PCB and through the base of the heat sink. A leaf type spring is snapped onto the upper ends of the pins and applies a downward pressure upon the heat sink. In one form of the invention the pins extend up to the level of the upper ends of the fins of the heat sink so that the spring puts pressure on the outer ends of the fins and thereby biases the base of the heat sink toward the chip. In another form of the invention the fins are milled or otherwise formed with a groove extending diagonally across the heat sink and the spring is positioned within the groove. In this form of the invention the ends of the pins are located at either end of the groove and the spring is simply attached thereto.

BRIEF DESCRIPTION OF THE DRAWINGS

The accompanying drawings, which are incorporated in and form a part of this specification, illustrate embodiments of the invention and, together with the description serve to explain the principles of the invention.

DETAILED DESCRIPTION OF THE PREFERRED EMBODIMENT

Figure 1:
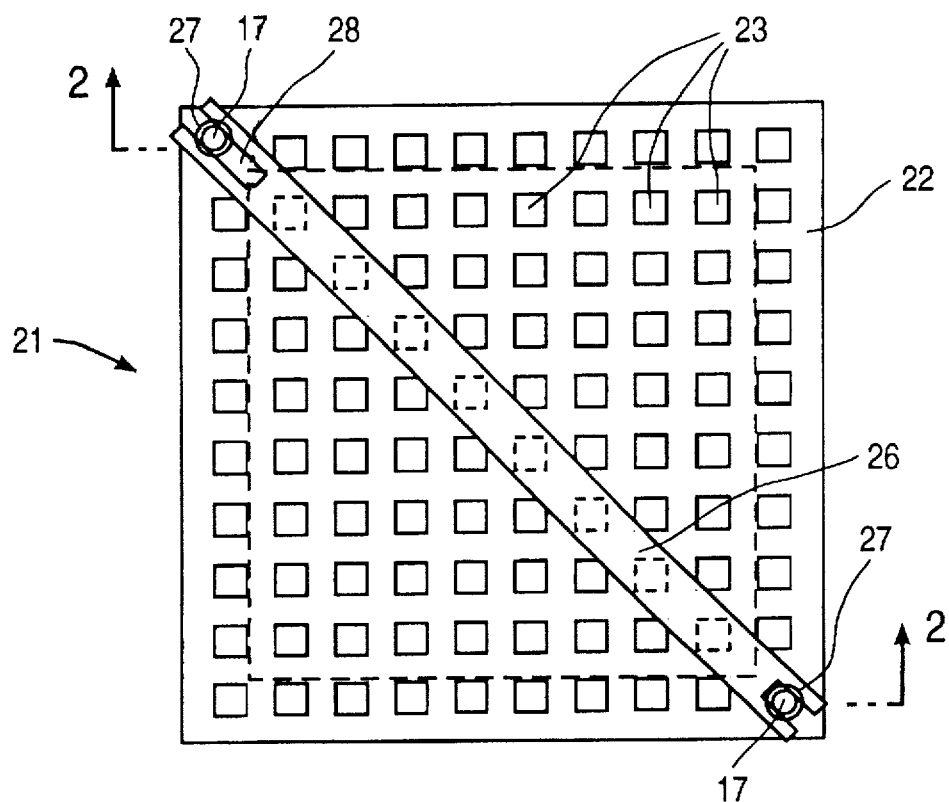
FIG. 1 is a top plan view of one form of the invention.

Reference will now be made in detail to the preferred embodiments of the invention, examples of which are illustrated in the accompanying drawings. While the invention will be described in conjunction with the preferred embodiments, it will be understood that they are not intended to limit the invention to those embodiments. On the contrary, the invention is intended to cover alternatives, modifications and equivalents, which may be included within the spirit and scope of the invention as defined by the appended claims.

A printed circuit board 11 or other support for a heat emitting element such as an electronic chip 12 or die is desirably cooled by means of a heat sink 21. Such a heat sink, as illustrated herein, has a rectangular base 22 which is designed to fit in close contact with the chip 12 in order to efficiently transfer heat from the chip to the base 22. Upstanding from base 22 are fins 23 here shown as square in cross-section and arranged in a checkerboard pattern. The fins 23 dissipate heat to the surrounding atmosphere. It will be understood that the heat sink 21 is subject to wide variation in shape and components.

Desirably a bolster plate 16 is positioned beneath the PCB 11 directly under the chip 12. Plate 16 is desirably of greater dimension than the chip 12. Upstanding from at least two corners of the rectangular bolster plate 16 are pins 17 which pass through holes in the PCB, are spaced from the chip 12 and also pass through holes in the corners in the base 22 of heat sink 21. Necks 18 are formed adjacent the upper ends of the pins 17.

Figure 7:
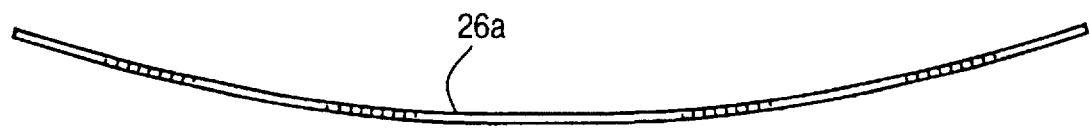
FIG. 7 is a side elevational view of the spring of FIG. 6.

In order to bias the base 22 into contact with the chip 12 springs 26 are used. As shown in FIG. 7, desirably the spring 26 is of the leaf variety and is bowed to augment the downward force which it applies to the heat sink. In the form of the invention shown in FIGS. 1–4, an inward extending notch or slot 27 is formed in one end of spring 26 (the lower right end as shown in FIG. 1) and an extended notch or slot 28 is formed in the opposite end of spring 26. Thus the ends of spring 26 clip on to the necked portions 18 of pins 17. As shown in FIG. 1, the spring 26 extends diagonally between the pins 17 across the tops of the fins 23 and the spring exerts a downward force on the fins 23 which is transmitted to the base 22, forcing it into heat transferring contact with chip 12.

Figure 6:
FIG. 6 is a plan view of a spring.

In the modification shown in FIG. 6, keyhole slots 31 are formed adjacent the ends of modified spring 26a. The largest portion of the keyhole is of sufficient diameter to fit over the outer end of pin 17 and the narrow portion of the keyhole fits into the neck 18.

Figure 2:
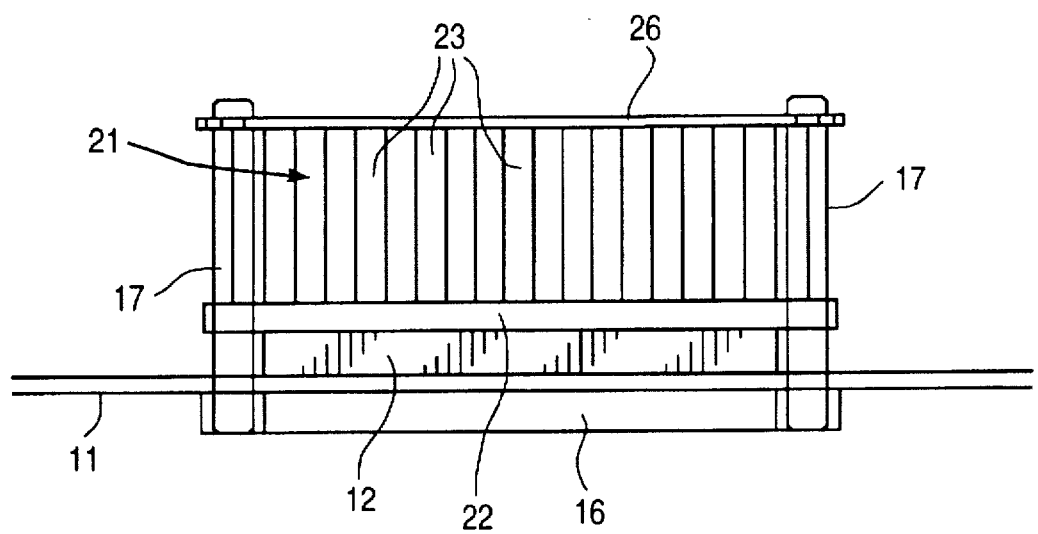
FIG. 2 is a sectional view taken substantially along the line 2—2 of FIG. 1.
Figure 3:
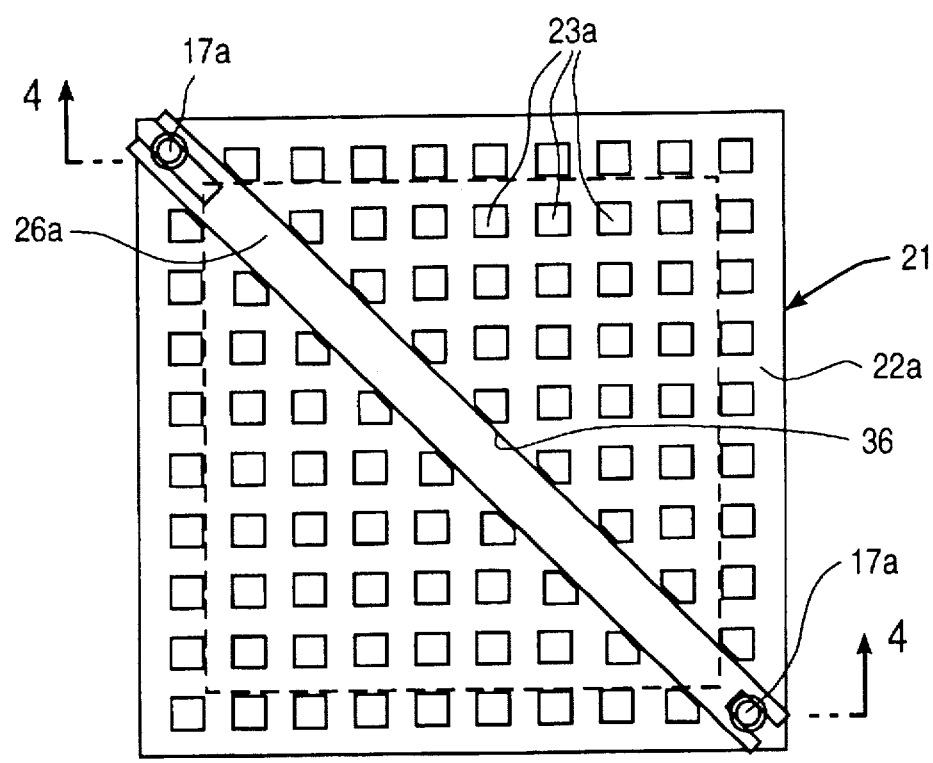
FIG. 3 is a view similar to FIG. 1 of a modification.
Figure 4:
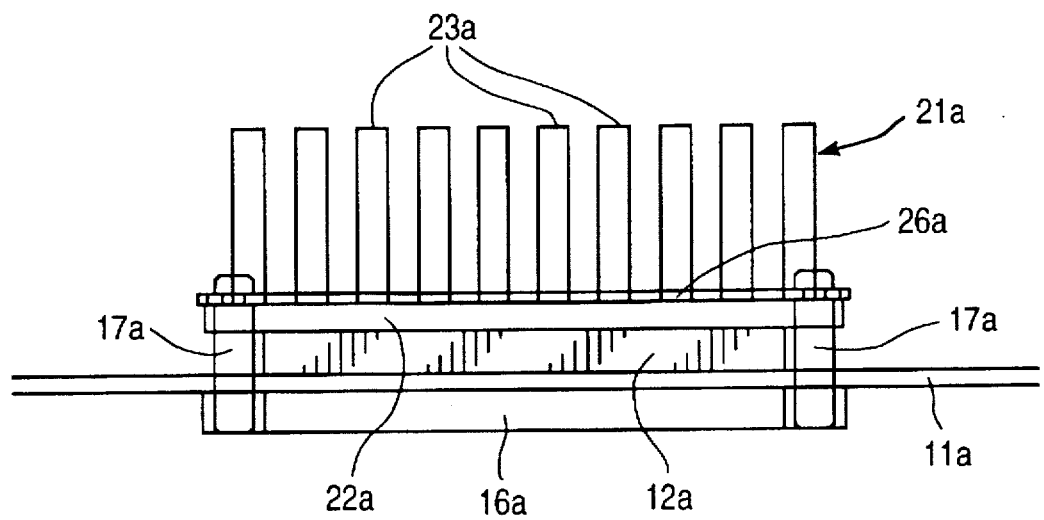
FIG. 4 is a sectional view taken substantially along the line 4—4 of FIG. 3.
Figure 5:
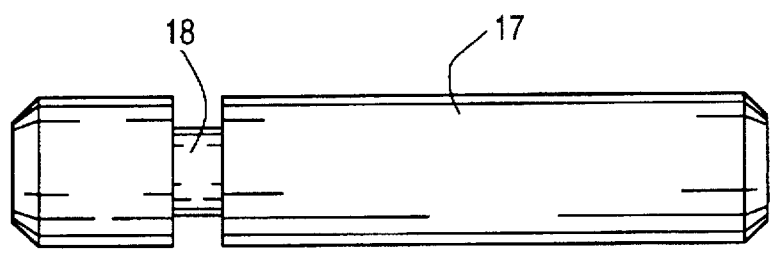
FIG. 5 is an enlarged elevational view of a pin used in the present invention.

The modification of FIGS. 3 and 4 differs from that of FIGS. 1 and 2 in that a diagonal groove 36 extends through the fins 23a slightly above the base 22a. Pins 17a extend slightly above the top of base 22a rather than extending above the tops of the fins 23 as shown in FIGS. 1 and 2. Hence the spring 26a is located immediately above the top of the base 22a rather than being above the tops of the fins 23a. In other respects the modification of FIGS. 3–4 resembles that of FIGS. 1 and 2 and the same reference numerals followed by the subscript a are used to designate corresponding parts.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

What is claimed is:

1. In combination, a heat sink having a base, a pair of pins having outer ends, support means fixed to said pins at a position on a first side of said base, a spring having ends on the second side of said base, connecting means detachably connecting one of each of said opposite ends to one of said pins whereby said spring biases said base toward said support means, said spring extending substantially parallel to said base, said connecting means being substantially at the level of said spring, and a heat emitting component in contact with said base, said spring biasing said base into thermal transfer relation with said component, said heat sink further comprising a plurality of fins extending from said base, said pins extending to a level adjacent the ends of said fins extending from said base and said spring extending across and bearing against the ends of some of said fins.

2. The combination of claim 1 in which said support means comprises a bolster plate.

3. The combination of claim 1 which further comprises a second support means on which said component is mounted, said second support means being positioned on the first side of said component.

4. The combination of claim 3 in which said second support means comprises a printed circuit board.

5. The combination of claim 4 in which said component is an electronic chip.

6. The combination of claim 1 in which said spring is of a leaf type and in which said connecting means comprises necks formed in said pins and slots formed in opposite ends of said spring, said slots engaging said necks.

7. The combination of claim 6 in which said slots extend longitudinally inwardly of said opposite ends of said springs.

8. The combination of claim 7 in which one of said slots is longer than the other said slot.

9. The combination of claim 6 in which said slots are keyhole shaped and located proximate said opposite ends of said spring, said keyhole shape having an enlarged portion larger than said pins and a narrower portion smaller than said pins but larger than said neck.

* * * * *

UNITED STATES PATENT AND TRADEMARK OFFICE
CERTIFICATE OF CORRECTION

PATENT NO. : 5,761,041
DATED : June 2, 1998
INVENTOR(S) : Ali Hassanzadeh and Hassan Siahpolo It is certified that error appears in the above-identified patent and that said Letters Patent is hereby corrected as shown below:

Title page, item [75], the name of the second inventor should read --Hassan Siahpolo--.

Signed and Sealed this

Fifteenth Day of September, 1998

Attest:

BRUCE LEHMAN

Attesting Officer

Commissioner of Patents and Trademarks